(12) United States Patent
Park et al.

(10) Patent No.: US 7,282,407 B1
(45) Date of Patent: Oct. 16, 2007

(54) SEMICONDUCTOR MEMORY DEVICE AND METHOD OF MANUFACTURING FOR PREVENTING BIT LINE OXIDATION

(75) Inventors: Young-woo Park, Gunpo (KR); Jun-yong Noh, Incheon (KR); Bon-young Koo, Suwon (KR); Chang-jin Kang, Suwon (KR); Chul Jung, Suwon (KR); Seok-woo Nam, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 09/008,525

(22) Filed: Jun. 29, 1998

(30) Foreign Application Priority Data

Jun. 10, 1997 (KR) .................................. 97-23917

(51) Int. Cl.
*H01L 21/8242* (2006.01)
(52) U.S. Cl. ................ 438/253; 438/396; 438/E21.648
(58) Field of Classification Search ................ 257/296, 257/303, 306, 307, 308, 309, E21.647, E21.648, 257/E21.657; 438/239, 253, 250, 396, 397, 438/254, 255, 398
See application file for complete search history.

(56) References Cited

U.S. PATENT DOCUMENTS

| | | |
|---|---|---|
| 5,126,280 A | 6/1992 | Chan et al. ................... 437/52 |
| 5,196,364 A | 3/1993 | Fazan et al. ................... 437/52 |
| 5,330,614 A | 7/1994 | Ahn ............................ 156/631 |
| 5,444,026 A | 8/1995 | Kim et al. |
| 5,445,999 A | 8/1995 | Thakur et al. .............. 437/242 |
| 5,595,928 A * | 1/1997 | Lu et al. ..................... 438/253 |
| 5,763,306 A * | 6/1998 | Tsai ............................ 438/255 |
| 5,897,983 A | 4/1999 | Hirota et al. |
| 6,025,247 A * | 2/2000 | Chang et al. ............... 438/396 |
| 6,268,244 B1 * | 7/2001 | Park ........................... 438/253 |

FOREIGN PATENT DOCUMENTS

| | | |
|---|---|---|
| EP | 0 539 233 | 4/1993 |
| JP | 08330539 | 12/1996 |

OTHER PUBLICATIONS

Japanese Abstract—Manufacture Of Semiconductor Storage Device, 1 page; Publication No. 09139478; Publication Date: May 27, 1997.
International Preliminary Report On Patentability dated Aug. 17, 2005, for European Patent Application No. EP 04 07 8044.
European Office Action dated Jul. 27, 2006.

* cited by examiner

*Primary Examiner*—Hoai Pham
(74) *Attorney, Agent, or Firm*—Harness, Dickey & Pierce

(57) ABSTRACT

A semiconductor memory device and method of manufacturing a semiconductor memory device that prevents oxidation of the bit lines caused by misalignment which may occur when patterning a storage electrode. An oxidation preventing layer, such as a nitride layer, is formed over the bit lines or in the contact holes to eliminate the diffusion of oxygen into the bit line structure, thereby preventing oxidation of the bit lines.

27 Claims, 7 Drawing Sheets

SEMICONDUCTOR MEMORY DEVICE AND METHOD OF MANUFACTURING FOR PREVENTING BIT LINE OXIDATION

BACKGROUND OF THE INVENTION

1. Field of the Invention

The present invention relates to a semiconductor memory device and manufacturing method, and more particularly, to a semiconductor memory device and method for manufacturing a semiconductor memory device that is resistant to oxidation of the bit lines.

2. Description of the Related Art

In manufacturing a dynamic random access memory (DRAM), in order to increase the operational speed of a device, a bit line is generally formed by a polycide structure obtained by depositing an impurity-doped polysilicon and a low-resistance silicide.

FIG. 1 is a sectional view for explaining a method for manufacturing a conventional DRAM.

Referring to FIG. 1, a transistor (not shown) is formed by a conventional manner on a semiconductor substrate 100 divided into an active regions (not shown) and field regions (not shown) by field oxide layers 12. Next, polysilicon is deposited on the resultant structure and then patterned, thereby forming a pad 14 for connecting a storage electrode to the active region (source region) of the semiconductor substrate 100. After the pad is formed, an insulating material is deposited on the resultant structure and then planarized, thereby forming a first insulating layer 16 for insulating the transistor from another conductive layer. To facilitate the planarization, the first insulating layer 16 may be formed of a fluid insulating layer, e.g., borophosphosilicate glass (BPSG) or undoped silicate glass (USG).

Next, a bit line contact (not shown) and bit line 18 and 20 is formed by a conventional method and then a planarized second insulating layer 22 is formed on the resultant structure. The bit line is formed by depositing a doped polysilicon layer 18 and a silicide layer 20 on the first insulating layer 16, and the second insulating layer 22 is formed in a similar manner to the first insulating layer 16. Subsequently, a nitride layer 24 and an oxide layer 26 are sequentially deposited on the resultant structure.

Next, the oxide layer 26, the nitride layer 24, the second insulating layer 22 and the first insulating layer 16 are anisotropically etched by photolithography to form a contact hole exposing the pad 14. A nitride layer is deposited on the surface of the resultant structure having the contact hole to form a spacer 28 on the sidewall of the contact hole. The spacer 28 helps prevent the oxidation of the bit lines by oxygen diffused through the sidewall of the contact hole.

Next, a polysilicon layer is deposited on the resultant structure, and patterned by photolithography to form a storage electrode 30. A dielectric layer 32 and a plate electrode 34 are formed on the storage electrode 30 by a conventional method. The dielectric layer 32 may be formed in an NO structure obtained by depositing a nitride layer and by forming a thermal oxide layer, for the purpose of improving capacitor characteristics. The nitride layer is typically formed by a chemical vapor deposition (CVD) method, and the oxide layer is formed by a thermal oxidation method. Other types of dielectrics such as ONO may also be used.

As semiconductor memory devices become highly integrated, misalignment may occur during the photolithography for forming the storage electrode 30. FIG. 2 is a sectional view showing an example of such misalignment.

In FIG. 2, if misalignment occurs between the etching mask for storage electrode 30 and the contact hole, an overetch may occur on the nitride layer spacer 28 when the storage electrode 30 is patterned by etching. Accordingly, the second insulating layer 22 is exposed at the sidewall of the contact hole. If the second insulating layer 22 is exposed, the nitride layer is deposited more thinly on the exposed second insulating layer 22 than on other layers when the dielectric layer 32 is formed in a subsequent step. This phenomenon is caused by the different deposition rates of the nitride layer, depending on the composition of the underlayer.

FIG. 3 shows the deposition characteristics of the nitride layer for both a wafer underlayer and a BPSG underlayer. In FIG. 3, "A" indicates the thickness of the nitride layer deposited on a bare wafer, and "B" indicates the thickness of the nitride layer deposited on a BPSG layer. As shown in the graph for a deposition time of 50 minutes, when the nitride layer is deposited on the bare wafer to a thickness of about 50 angstroms, the nitride layer is deposited to be only 37 angstroms thick on the BPSG layer. Therefore, as shown in FIG. 2, the second insulating layer 22 is susceptible to oxygen diffusion because the oxygen used during thermal oxidation in forming the oxide in the dielectric layer 34 may penetrate into a portion of second insulating layer 22 where the nitride layer is deposited thinly. The bit line 18 and 20 may become oxidized, thereby changing its electrical characteristics. The resulting increased resistance in the bit line may cause the memory device to become inoperative or unreliable.

SUMMARY OF THE INVENTION

It is therefore an object of the present invention to provide a method for manufacturing a semiconductor memory device that prevents oxidation of a bit line.

It is another object of the present invention to provide a semiconductor memory device having a structure that prevents oxidation of a bit line.

To accomplish the above objects of the present invention, there is provided a method for manufacturing a semiconductor memory device including the step of forming first insulating layer on a semiconductor substrate. Bit lines connected to the semiconductor substrate are formed on the first insulating layer. Then, an oxidation preventing layer is formed on the resultant structure. A second insulating layer is formed on the oxidation preventing layer and a contact hole exposing a portion of the semiconductor substrate is formed. A storage electrode connected to the portion of the semiconductor substrate through the contact hole is formed. A dielectric layer and a plate electrode are sequentially formed on the storage electrode.

The bit lines may be formed by the sequential deposition and patterning of polysilicon and silicide, or the bit lines may be formed of other suitable conductors.

The oxidation preventing layer may be formed of a nitride layer and is preferably formed to a thickness of about 1,000 angstroms or below. The nitride layer may be formed using a low pressure chemical vapor deposition (LPCVD) process, a rapid thermal nitridation (RTN) process, or by other processes for forming a nitride layer. The LPCVD process may be performed at a temperature of about 500~700° C. under a pressure of about 1 torr or less using a gas mixture of dichlorosilane ($SiH_2Cl_2$) and ammonia ($NH_3$) as a reactant gas. The RTN process is preferably performed at a temperature of about 800~1000° C. under atmospheric pressure or less using an ammonia ($NH_3$) gas as a reactant gas.

The oxidation preventing layer may be formed by nitriding the surface of the resultant structure containing the bit lines using a gas containing nitrogen. An ammonia ($NH_3$) or similar gas may be used as the gas containing the nitrogen, and a plasma method, a thermal annealing method, or a rapid thermal process (RTP) may be employed.

The oxidation preventing layer may be formed to be thicker at the side walls and on top of the bit line than on the surface of the second insulating layer.

The step of forming the dielectric layer comprises the steps of depositing a nitride layer on the storage electrode, and oxidizing the semiconductor substrate having the nitride layer under a wet-oxidative atmosphere. The wet oxidation is preferably performed at a temperature of about 700~900° C.

A spacer may be formed on the sidewall of the contact hole before forming the storage electrode. A second spacer may be formed over the first spacer.

According to another aspect of the present invention, there is provided a method for manufacturing a semiconductor memory device including the step of forming a first insulating layer on a semiconductor substrate. The bit lines are formed on the first insulating layer. A second insulating layer is formed on the resultant structure containing the bit line and a contact hole is formed to expose a portion of the semiconductor substrate. A dual spacer comprised of a nitride layer and an oxide layer is formed on the sidewall of the contact hole. A storage electrode connected to the portion of the semiconductor substrate through the contact hole is formed, and a dielectric layer and a plate electrode are sequentially formed on the storage electrode.

The bit lines may be formed by sequentially depositing and patterning polysilicon and silicide.

The oxide layer for the dual spacer may be composed of a high temperature oxide (HTO) layer or an undoped silicate glass (USG) layer. The nitride layer and the oxide layer for the dual spacer are each preferably formed to a thickness of about 100~300 angstroms.

The step of forming the dielectric layer comprises the steps of depositing a nitride layer on the resultant structure having the storage electrode, and oxidizing the nitride layer under a wet-oxidative atmosphere. The wet oxidation is preferably performed at a temperature of about 700~900° C.

According to still another aspect of the present invention, there is provided a method for manufacturing a semiconductor memory device including the step of forming a first insulating layer on a semiconductor substrate. Bit lines are formed on the first insulating layer and a second insulating layer is formed on the resultant structure. A contact hole exposing a portion of the semiconductor substrate is formed. A storage electrode connected to the portion of the semiconductor substrate through the contact hole is formed. An oxidation preventing layer is formed on the surface of the structure containing the storage electrode. A dielectric layer and a plate electrode are sequentially formed on the resultant structure.

The bit lines may be formed by sequentially depositing and patterning polysilicon and silicide.

The oxidation preventing layer may be formed by nitriding the surface of the resultant structure having the storage electrode using a gas containing nitrogen. An ammonia ($NH_3$) or similar gas may be used as the gas containing the nitrogen. Also, the nitridation process may be performed using a plasma method, a thermal annealing method, a rapid thermal process (RTP), or a similar process.

The step of forming the dielectric layer comprises the steps of depositing a nitride layer on the resultant structure having the storage electrode, and oxidizing the nitride layer under a wet-oxidative atmosphere. The wet oxidation is preferably performed at a temperature of about 700~900° C.

A spacer may be formed on the sidewall of the contact hole before forming the storage electrode.

According to yet another aspect of the present invention, a first insulating layer is formed on a semiconductor substrate. Bit lines connected to a first active region of the semiconductor substrate are formed on the first insulating layer. An oxidation preventing layer is formed to encase the bit lines and to be thicker at the side walls and on top of the bit lines than on the surface of the first insulating layer. A second insulating layer is formed to cover the oxidation preventing layer. A contact hole is formed by etching the second insulating layer, oxidation preventing layer and first insulating layer; a storage electrode connected through the contact hole to a second active region of the semiconductor substrate is then formed; and a dielectric layer covering the storage electrode and a plate electrode covering the dielectric layer are sequentially formed.

It is preferable that the oxidation preventing layer is formed of a nitride layer and the thickness thereof is less than 1,000 angstroms.

A spacer may be further formed on the inner sidewall of the contact hole, and the dielectric layer is preferably formed of a dual layer comprised of a nitride layer and an oxide layer. A second spacer may be formed over the first spacer.

According to the present invention, even if misalignment occurs in patterning a storage electrode, the bit lines may be prevented from being oxidized in the course of forming a dielectric layer, which would lower the conductivity of the bit lines. That is, the oxidation prevention layer is for maintaining the initial conductivity of the bit lines. Also, this process allows the subsequent step of forming the dielectric to be performed easily.

BRIEF DESCRIPTION OF THE DRAWINGS

The above object and advantages of the present invention will become more apparent by describing in detail preferred embodiments thereof by reference to the attached drawings in which.

DESCRIPTION OF THE PREFERRED EMBODIMENTS

Embodiment 1

FIGS. 4 through 7 are sectional views for explaining a method of forming a semiconductor memory device according to a first embodiment of the present invention.

Figure 1:
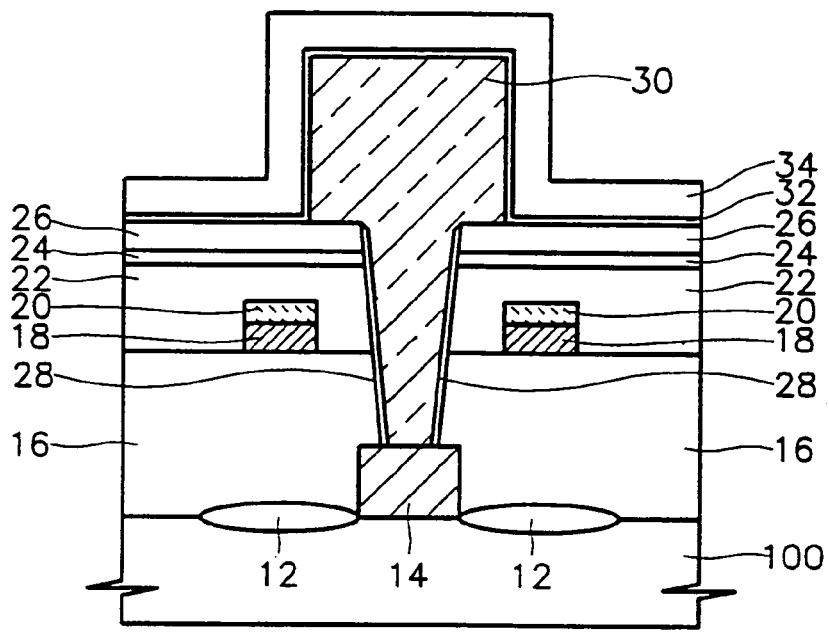
FIG. 1 is a sectional view taken in a direction of a word line, for explaining a method for forming a conventional DRAM.
Figure 2:
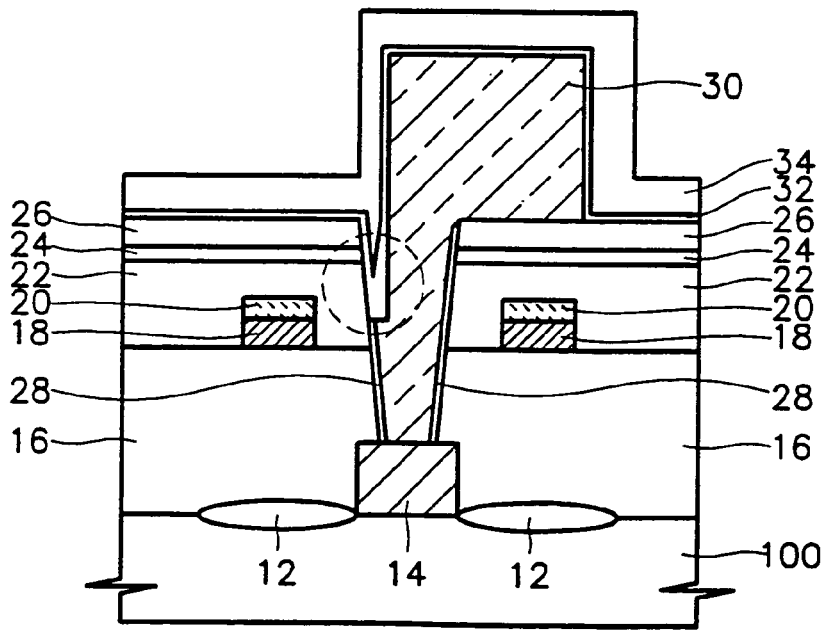
FIG. 2 is a sectional view showing a situation in which misalignment occurs during photolithography for forming a storage electrode.
Figure 3:
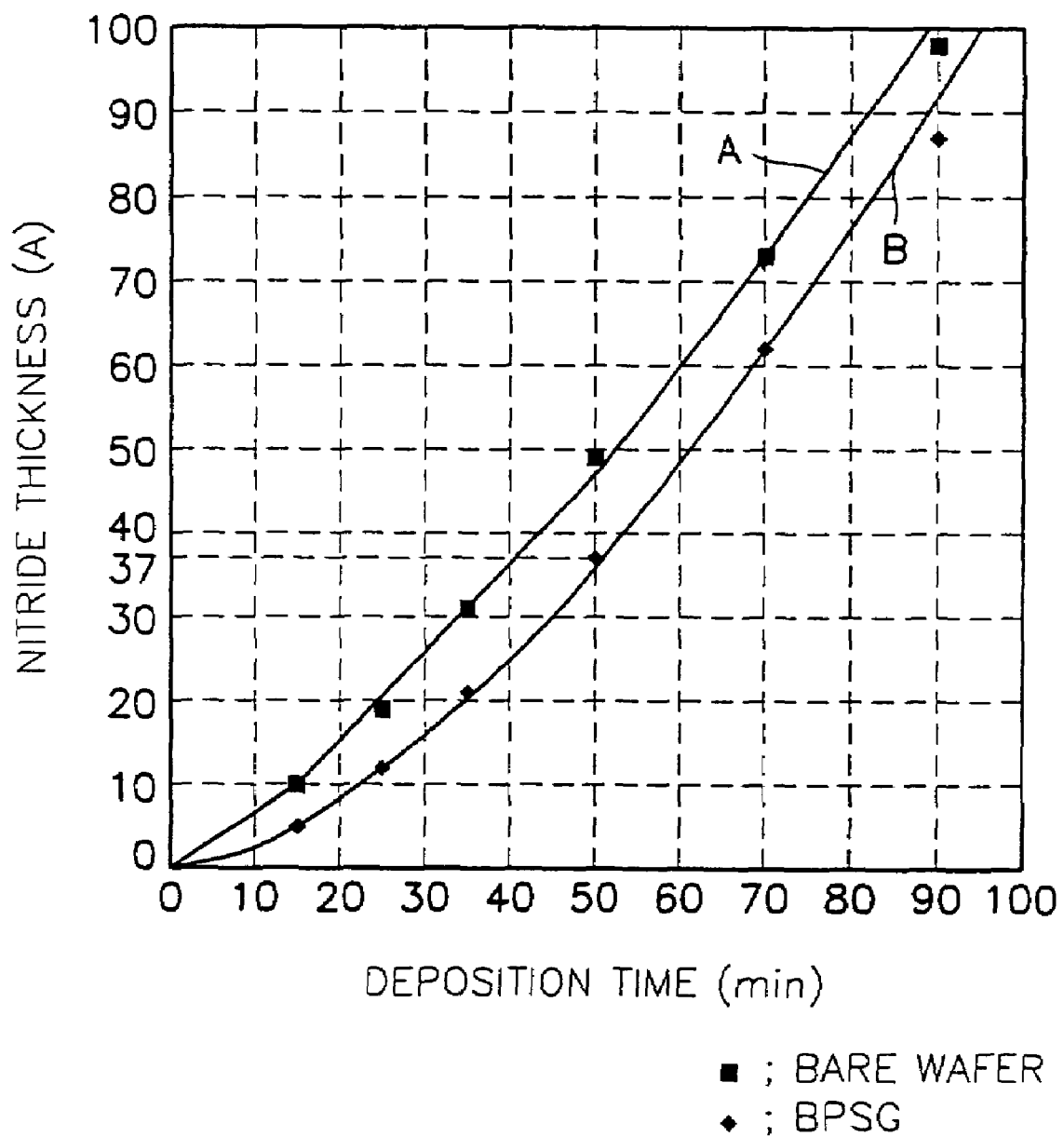
FIG. 3 is a graph showing deposition characteristics of a nitride layer depending on the underlayer composition.
Figure 4:
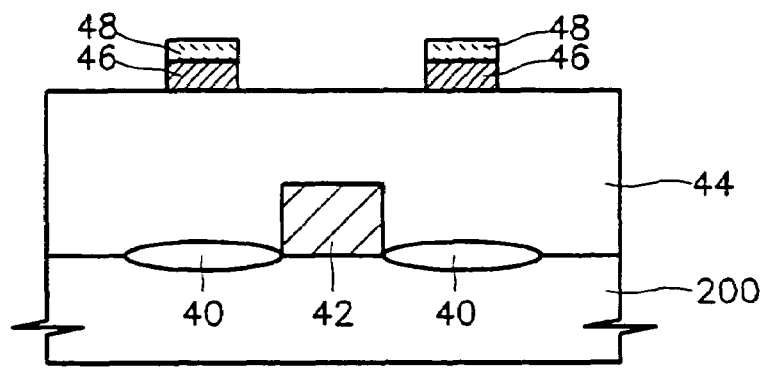
FIGS. 4 through 7 are sectional views for explaining a method of forming a semiconductor memory device according to a first embodiment of the present invention.

FIG. 4 shows the steps of forming a transistor (not shown), a pad 42 and a bit line 46 and 48. Field oxide layers 40 divide a semiconductor substrate 200 into active regions (not shown). The field oxide is formed by a conventional isolation technology. Then, a transistor (not shown) having a gate, a source and a drain (not shown) is formed in the active region of the semiconductor substrate 200. The semiconductor substrate is typically polysilicon, although it may be formed of other semiconductor material. Polysilicon is then deposited on the resultant structure having the transistor and is patterned, thereby forming a pad 42 connected to the source (not shown) of the transistor. An insulating layer is deposited on the resultant structure and is planarized, thereby forming a first insulating layer 44 for insulating the transistor from other conductive layers. To facilitate the planarization, the first insulating layer 44 may be formed of a borophosphosilicate glass (BPSG) layer, an undoped silicate glass (USG) layer, or another suitable insulating material Next, the first insulating layer 44 is partially etched to form a contact hole (not shown) exposing the drain (not shown) of the transistor. A doped polysilicon layer and a silicide layer are sequentially formed on the resultant structure and then patterned, thereby forming bit lines 46 and 48, which are connected to the transistor drains through contact holes (not shown).

Figure 5:
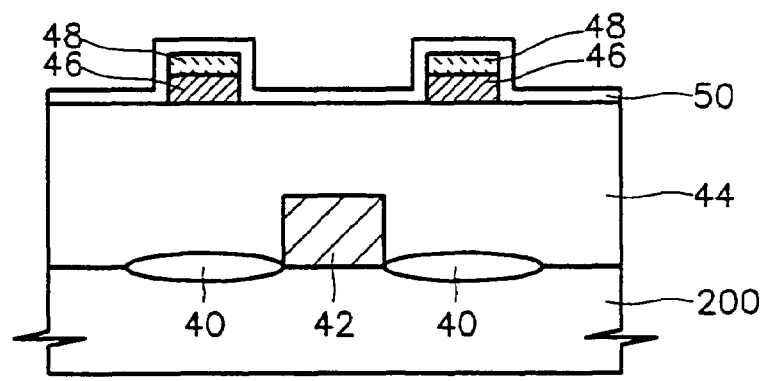

FIG. 5 shows the step of forming an oxidation preventing layer 50 for preventing oxidation of the bit lines 46 and 48. An insulating material for preventing oxidation, e.g., a nitride layer, is deposited over the entire surface of the resultant structure comprising the first insulating layer 44 and bit lines 46 and 48, thereby forming the oxidation preventing layer 50. The oxidation preventing layer 50 serves to prevent oxidation of the bit lines 46 and 48 during a subsequent oxidation process associated with forming a dielectric layer for a capacitor. In this embodiment, the oxidation preventing layer 50 is preferably formed to be thick enough to prevent oxidation of the bit line 46 and 48, e.g., to a thickness of 1,000 angstroms or less.

Figure 6:
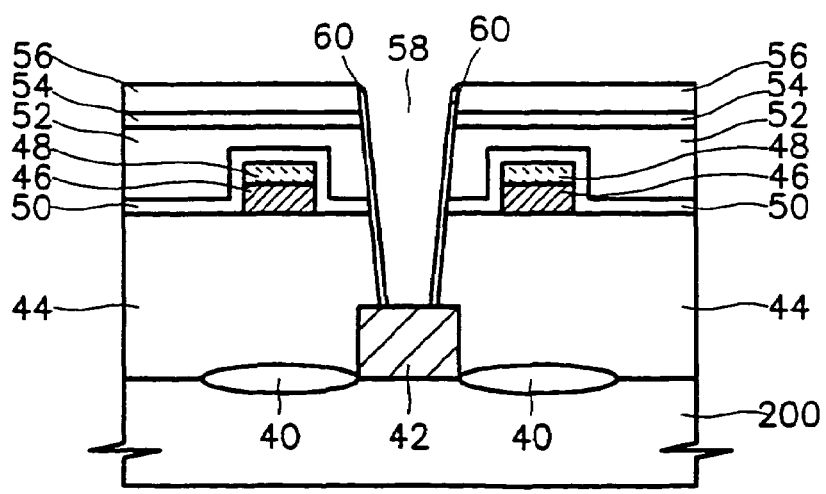

FIG. 6 shows the steps of and forming a contact hole 58 and forming a spacer 60. An insulating layer which may be easily planarized, e.g., a BPSG or USG layer, is deposited over the entire surface of the resultant structure having the oxidation preventing layer 50 and then flowed, thereby forming a second insulating layer 52. The second insulating layer 52 not only insulates the bit line 46 and 48 from other conductive layers but also planarizes the step that occurs due to the height of the bit line 46 and 48, thereby facilitating subsequent processes. Next, a nitride layer 54 of about 500 angstroms thickness and an oxide layer 56 of about 2,000 angstroms thickness are sequentially deposited on the resultant structure.

Subsequently, the oxide layer 56, the nitride layer 54, the second insulating layer 52, the oxidation preventing layer 50 and the first insulating layer 44 are sequentially anisotropically etched by photolithography, thereby forming a contact hole 58 for connecting the storage electrode to the pad 42. Next, a nitride layer having a thickness of 500 angstroms or less is deposited on the resultant structure and then anisotropically etched, thereby forming the spacer 60 at the inner side walls of the contact hole 58. The spacer 60 is for preventing the bit lines 46 and 48 from being oxidized from the sidewall of the contact hole 58.

Figure 7:
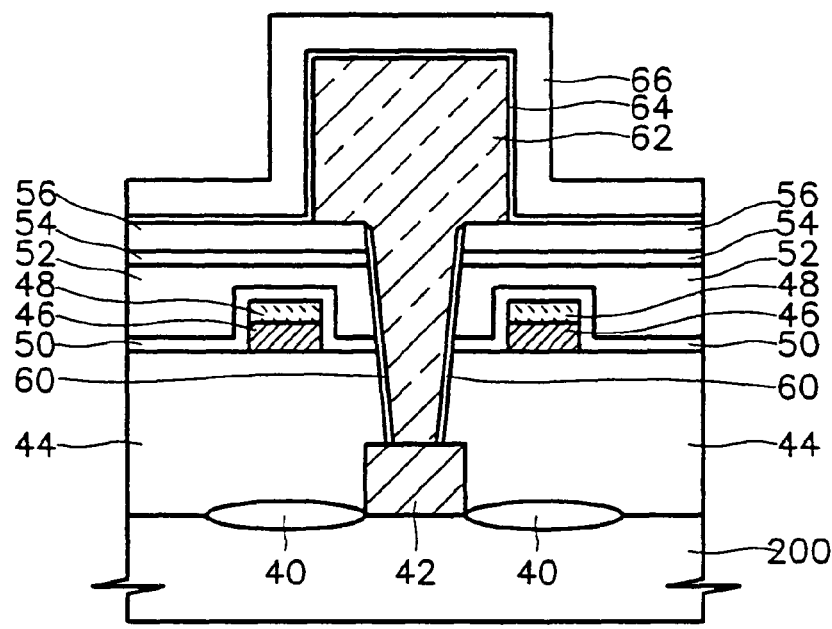

FIG. 7 shows the step of forming a capacitor comprised of a storage electrode 62, a dielectric layer 64, and a plate electrode 66. A doped polysilicon layer is deposited to a predetermined thickness over the entire surface of the resultant structure having the spacer 60 and then anisotropically etched to form the storage electrode 62 connected to the pad 42. Subsequently, the dielectric layer 64 for a capacitor is formed. To form the dielectric layer 64, a thin nitride layer is first deposited over the entire surface of the resultant structure having the storage electrode 62. At this point, if the second insulating layer 52 on the sidewall of the contact hole is exposed by misalignment between the mask for patterning the storage electrode 62 and the contact hole 58 formed during photolithography, the nitride layer is deposited thinly on the area where the second insulating layer 52 is exposed, as compared with the thickness of the nitride layer deposited the other structures. Thereafter, the nitride dielectric layer is oxidized under a wet-oxidation atmosphere at a high temperature of about 700~900° C., thereby forming an oxide layer on the nitride layer. In the conventional memory device, the bit lines 46 and 48 are oxidized by oxygen ($O_2$) diffused through a portion of the first insulating layer where the nitride layer for a dielectric layer is deposited thinly during the oxidation step. However, according to the present invention, the bit lines 46 and 48 are protected from oxidation because they are surrounded by the oxidation preventing layer 50. Finally, a doped polysilicon layer is deposited on the resultant structure having the dielectric layer 64 and then patterned, thereby forming the plate electrode 66.

Embodiment 2

Figure 8:
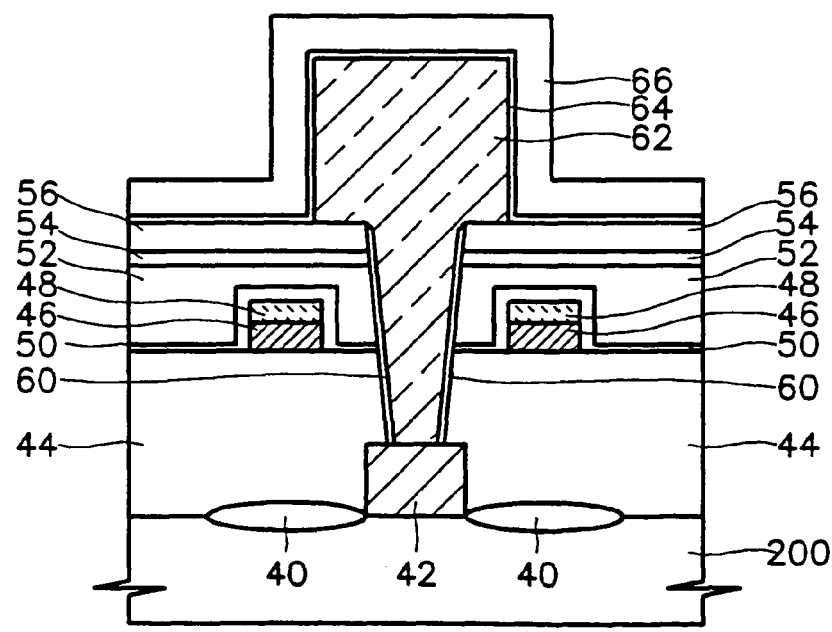
FIG. 8 is a sectional view for explaining a method of forming a semiconductor memory device according to a second embodiment of the present invention.

FIG. 8 is a sectional view for explaining a method for forming a semiconductor memory device according to a second embodiment of the present invention. Here, those elements which are the same as those of FIG. 7 are designated by the same reference numerals.

Oxidation of bit lines can be prevented by depositing a thin nitride layer (about 70 angstroms) serving as an oxygen diffusion preventing layer, after forming the bit lines, and depositing the insulating layer thereon. However, this method may cause a severe impediment to a self-aligned contact (SAC) process in a subsequent process, i.e., a process of forming a contact hole for connecting a storage electrode to the semiconductor substrate. In the SAC process, it is necessary for an etchant to have a high selectivity for the insulating layer and the nitride layer. Thus, even if the nitride is as thin as about 70 angstroms, the nitride layer may readily cause etching stop or produce a sill or ledge on the top of the contact hole. In a process other than the SAC process, the aspect ratio of the contact hole increases in highly integrated devices. Thus, a process having a fast etch rate such as a high density plasma process is widely used. Since the selectivity for the nitride layer is also high in this case, the contact hole may not open completely, which readily causes malfunctions in the semiconductor device.

In order to solve these problems, in this embodiment, an oxidation preventing layer 50 for preventing oxidation of bit lines 46 and 48, such as a nitride layer, is deposited such that the oxidation preventing layer is deposited more thickly on the sidewalls and the top of the bit lines, and is deposited thinly on the first insulating layer 44. If the nitride layer is deposited as an oxidation preventing layer 50 using a LPCVD method or a RTN method, initial layer growth rates of the nitride layer may differ depending on the physical properties of the bit line and the insulating layer. In other words, when the nitride layer is deposited on the bit lines (comprising silicide and polysilicon) to a desired thickness, the nitride layer is deposited more thinly on the first insulating layer 44 comprising BPSG or USG. The reason for the foregoing is that it is difficult to attain initial nucleation of the nitride layer on the BPSG layer. For example, when the nitride layer is deposited on the bit lines to a thickness of about 50 angstroms, the nitride layer is deposited on the BPSG layer to a thickness of about 10~20 angstroms.

According to this method, even if misalignment occurs when patterning the storage electrode, which causes the nitride layer for a dielectric layer 64 to be deposited thinly, since the bit lines 46 and 48 are surrounded by the oxidation preventing layer 50, oxidation of the bit lines is effectively prevented. Also, since the oxidation preventing layer 50 is deposited thinly on the first insulating layer 44, the subsequent step of forming the contact hole for connecting the storage electrode 62 to the pad 42 can be easily performed.

If the LPCVD method is employed, the oxidation preventing layer 50 is preferably deposited under a pressure of 1 torr or less at a temperature of 900±100° C. using a mixed gas of dichlorosilane ($SiH_2Cl_2$) and ammonia ($NH_3$) as a reactant gas. If the RTN method is employed, the oxidation preventing layer is deposited at a temperature of 900±100° C. using an ammonia ($NH_3$) gas as a reactant gas, and is preferably deposited under atmospheric pressure or a lower pressure.

This embodiment facilitates the subsequent process for forming a contact hole and connecting the storage electrode to the semiconductor substrate.

Embodiment 3

Figure 9:
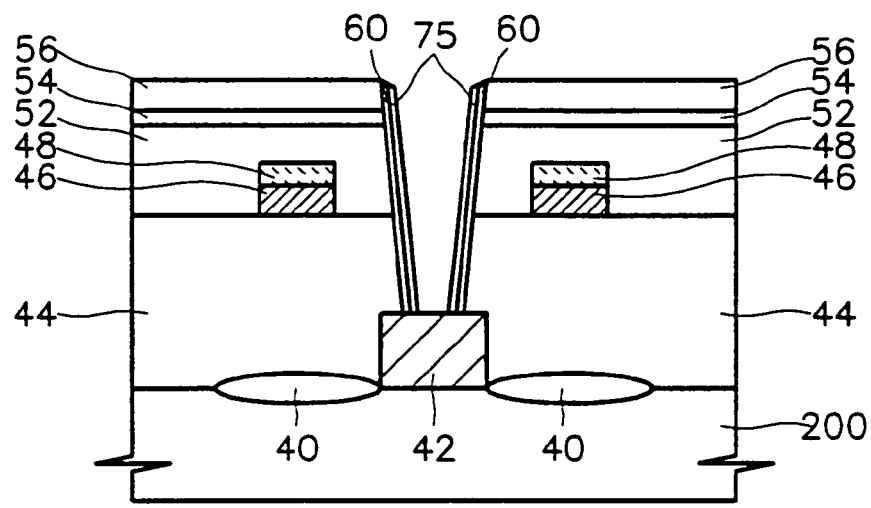
FIGS. 9 and 10 are sectional views for explaining a method of forming a semiconductor memory device according to a third embodiment of the present invention.
Figure 10:
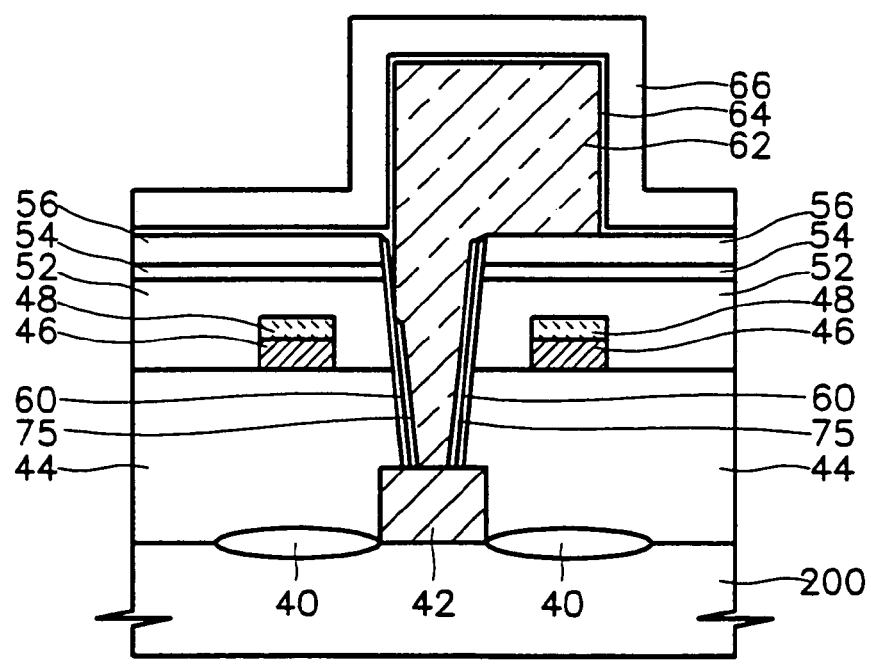

FIGS. 9 and 10 are sectional views for explaining a method of forming a semiconductor memory device according to a third embodiment of the present invention.

Referring to FIG. 9, the same steps as those in the first embodiment are performed until a contact hole for connecting the storage electrode to the pad 42 is formed, with the exception that the oxidation preventing layer 50 (see FIG. 7) in the first embodiment is not formed. Next, a nitride layer 60 and an oxide layer 75 are sequentially deposited over the entire surface of the resultant structure having the contact hole. The oxide layer 75 may be a high temperature oxide (HTO) layer or an undoped silicate glass (USG) layer. Next, the nitride layer 60 and the oxide layer 75 are anisotropically etched, thereby forming a dual spacer comprised of the nitride layer 60 and the oxide layer 75 on the sidewall of the contact hole.

Referring to FIG. 10, a storage electrode 62 connected to the pad 42, a dielectric layer 64 and a plate electrode 66 are sequentially formed on the resultant structure having the dual spacer. In the course of performing photolithography for forming the storage electrode 62 after depositing a doped polysilicon layer, as shown in FIG. 10, the contact hole may be partially exposed by misalignment. However, since the spacer is formed doubly on the sidewall of the contact hole, even if an overetch is performed during the patterning of the storage electrode 62, much of the spacer formed of the nitride layer 60 is still left. That is to say, the surface of the second insulating layer 52 is not exposed by the overetch.

Thus, the oxidation of the bit lines 46 and 48 may be prevented because the nitride layer 60 forms a barrier against diffusion of oxygen into the second insulating layer 52.

In this embodiment, to prevent the oxidation of the bit line, a nitride spacer 60 of at least 50 angstroms must be left on the surface of the second insulating layer 52. In other words, even if the nitride layer is etched from the upper inner side walls of the contact hole by the misalignment generated between the storage electrode 62 and the contact hole, the oxidation of the bit line can be prevented if the thickness of the remaining nitride layer is more than 50 angstroms. Therefore, the nitride layer 60 and the oxide layer 75 for a spacer are preferably each formed to a thickness of approximately 100~300 angstroms.

Embodiment 4

Figure 11:
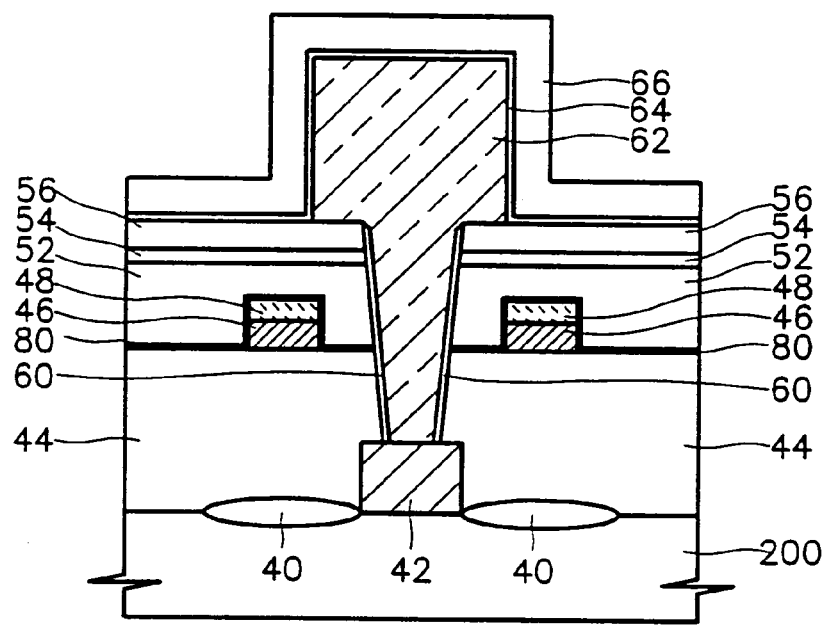
FIG. 11 is a sectional view for explaining a method of forming a semiconductor memory device according to a fourth embodiment of the present invention.

FIG. 11 is a sectional view for explaining a method of forming a semiconductor memory device according to a fourth embodiment of the present invention. Here, those elements which are the same as those in the first embodiment are designated by the same reference numerals.

Referring to FIG. 11, the same steps as those in the first embodiment are performed until the bit lines 46 and 48 are formed. Next, the surface of the resultant structure having the first insulating layer 44 and bit lines 46 and 48 is nitrided using a nitrogen-containing gas. As a result, a thin nitride layer 80 is formed on the surface of the resultant structure, as shown. Therefore, the same effects as in the first and second embodiments can be obtained.

Also, because the nitride layer 80 formed by nitridation is very thin, i.e., 30~50 angstroms, a nitride sill or ledge is not produced on the sidewall of the contact hole when the contact hole is etched.

The surface of the resultant structure having the bit lines 46 and 48 may be processed by using a plasma method, a thermal annealing method, an RTP, or a similar process. A gas containing nitrogen, such as ammonia ($NH_3$) gas, can be used as a reactant gas. The plasma method is preferably performed at a temperature of 200~400° C. for more than 1 minute. The thermal annealing method is preferably performed at a temperature of 800~900° C. for more than 30 minutes. The RTP is preferably performed at a temperature of 800~1000° C. for more than 1 minute. The temperatures and times associated with these processes may be varied to achieve the desired nitridation result.

Embodiment 5

Figure 12:
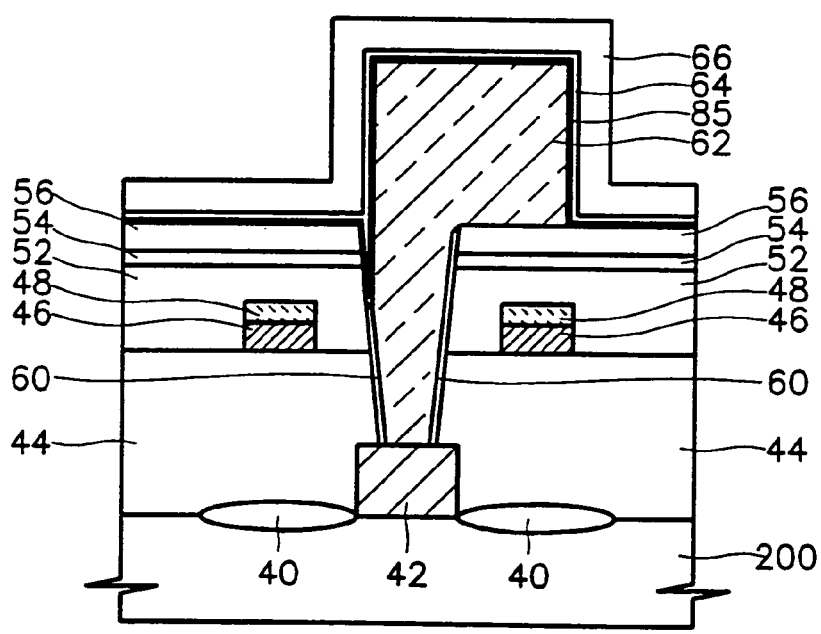
FIG. 12 is a sectional view for explaining a method of forming a semiconductor memory device according to a fifth embodiment of the present invention.

FIG. 12 is a sectional view for explaining a method of forming a semiconductor memory device according to a fifth embodiment of the present invention. Here, those elements which are the same as those of the first embodiment are designated by the same reference numerals.

Referring to FIG. 12, the same steps as those in the first embodiment are performed until a storage electrode 62 is formed, with the exception that the oxidation preventing layer 50 in the first embodiment is not formed. In this embodiment, if misalignment occurs when patterning the storage electrode 62, the surface of the second insulating layer 52 in the upper portion of the contact hole is exposed. However, the surface of the resultant structure having the storage electrode 62 is nitrided using a gas containing nitrogen by the same method as in the fourth embodiment. As a result, as in the fourth embodiment, a thin nitride layer 85 having a thickness of about 30~50 angstroms is formed on the surface of the resultant structure. Thereafter, a dielectric layer 64 and a plate electrode 66 are formed.

As in the fourth embodiment, the surface of the resultant structure may be processed by using a plasma method, a thermal annealing method, an RTP, or a similar method. A gas containing nitrogen, such as ammonia ($NH_3$) gas, may be used as a reactant gas.

When the surface of the resultant structure is nitrided after forming the storage electrode 62, the surface of the exposed second insulating layer 52 is also nitrided. Accordingly, since a nitride layer for a dielectric layer 64 is formed on nitrided underlayers during a step of forming the dielectric layer, the dielectric layer may be formed more thickly rather than being dependent on the individual properties of the different underlayers. Therefore, the nitride layer for a dielectric layer is deposited on the surface of the second insulating layer 52 as thickly as or thicker than on the surface of the storage electrode 62. Therefore, the bit line oxidation due to diffused oxygen can be prevented when the oxide layer in the dielectric is subsequently formed.

EXAMPLE

Figure 13:
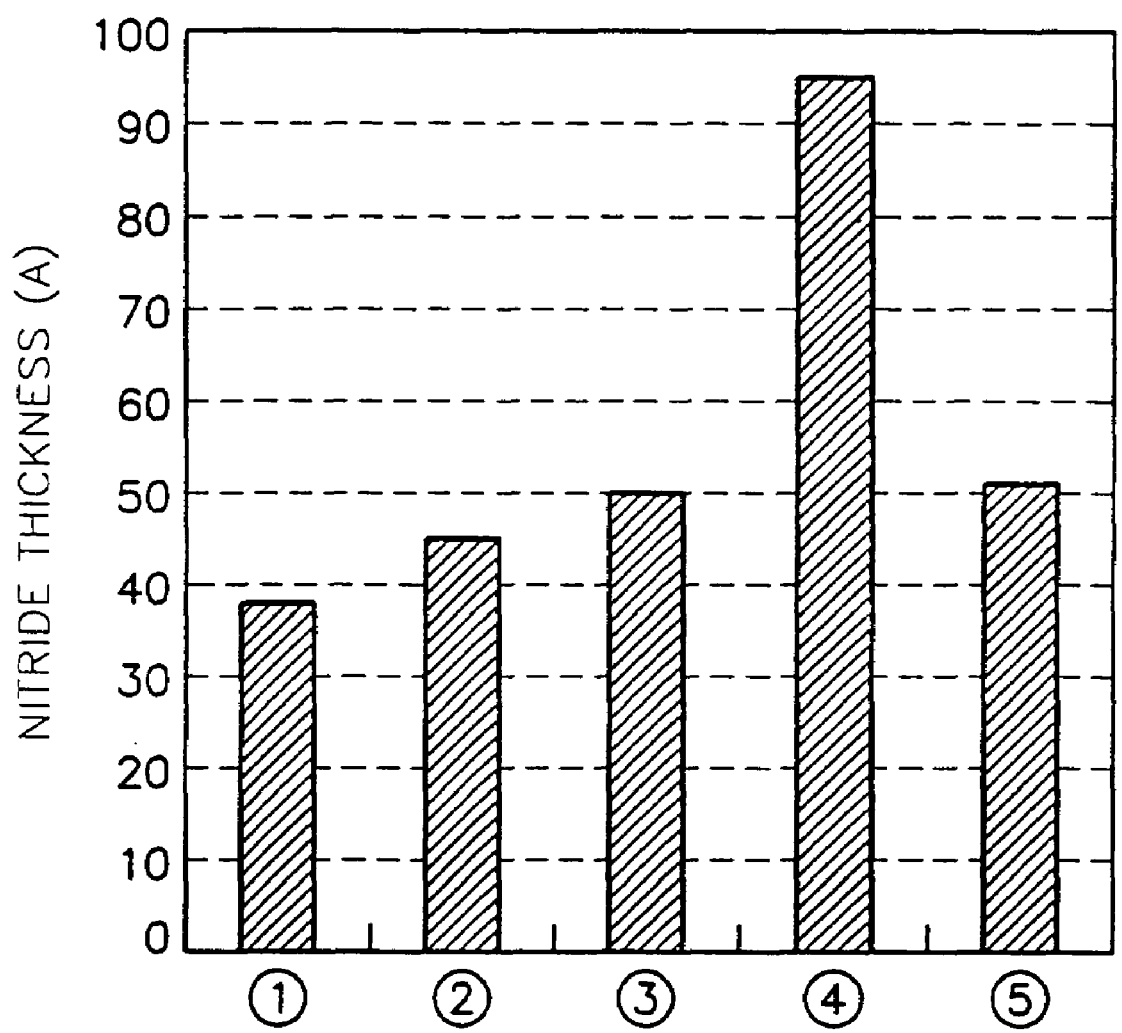
FIG. 13 is a graph that compares the thicknesses of a nitride layer deposited on a BPSG layer depending on the surface processing used before depositing the nitride layer.

FIG. 13 is a graph for comparing the thicknesses of the nitride layers deposited on a BPSG layer before and after nitridation the surface of the BPSG layer. The nitridation is performed for the purpose of eliminating the dependence of the nitride layer on the composition of the underlayer.

In FIG. 13, ① indicates the case of omitting a surface processing, ② indicates the case of performing a plasma process at a temperature of 400° C. for 240 seconds using an ammonia ($NH_3$) gas, ③ indicates the case of performing an RTN process at a temperature of 800° C. for 90 seconds, ④ indicates the case of performing an RTN process at a temperature of 1,000° C. for 90 seconds, and ⑤ indicates the case of performing a thermal annealing process at a temperature of 820° C. for 60 minutes using an ammonia ($NH_3$) gas.

As can be seen from FIG. 13, the nitride layer is deposited thicker in the case of depositing the same after processing the surface than in the case of omitting the surface processing. Therefore, surface processing by nitriding the surface of the storage electrode structure tends to eliminate the dependence on the underlayer of the nitride layer thickness in the dielectric layer 64, so that the nitride layer is deposited on the surface of the exposed second insulating layer (52 of FIG. 12) as thickly as or thicker than on the surface of the storage electrode (62 of FIG. 12).

As described above, in the method for manufacturing a semiconductor memory device according to the present invention, after forming a bit line or a storage electrode, an oxidation preventing layer is formed on the resultant structure. Alternatively, a dual spacer may be formed on the sidewall of the contact hole. Accordingly, even if misalignment occurs when patterning the storage electrode, the bit lines may be prevented from being oxidized by oxygen diffused through the sidewall of the contact hole during the formation of a dielectric layer. Particularly, by nitriding the surface of the resultant structure obtained after forming the bit lines or storage electrodes, the oxidation of the bit lines may be prevented.

Although the present invention has been described in detail through illustrative embodiments, the invention is not limited to the above-described embodiments. Various modifications may be performed by one skilled in the art within the scope and spirit of this invention.

What is claimed is:

1. A method for manufacturing a semiconductor memory device comprising the steps of:
   forming a pad on a semiconductor substrate;
   forming a first insulating layer on the semiconductor substrate;
   forming a plurality of bit lines on the first insulating layer, each of the plurality of bit lines including a plurality of bit line layers;
   forming an oxidation preventing layer over substantially the entire surface of the bit lines, the oxidation preventing layer arranged to contact all of the bit line layers of each of the bit lines;
   forming a second insulating layer on the oxidation preventing layer;
   forming a contact hole exposing the pad on the semiconductor substrate by patterning the second insulating layer, the oxidation preventing layer, and the first insulating layer, the oxidation preventing layer remaining interposed between the contact hole and the bit lines;
   forming a storage electrode over the second insulating layer and connected to the portion of the semiconductor substrate through the contact hole; and
   sequentially forming a dielectric layer and a plate electrode on the storage electrode,
   wherein the oxidation preventing layer is a nitride layer.

2. The method of claim 1, wherein the nitride layer is formed to a thickness equal to or less than about 1,000 angstroms.

3. The method of claim 1, wherein the nitride layer is formed by a low pressure chemical vapor deposition (LPCVD) process.

4. The method of claim 3, wherein the LPCVD process is performed at a temperature of about 800~1000° C. under a pressure of about 1 torr or less using a gas mixture of dichlorosilane ($SiH_2Cl_2$) and ammonia ($NH_3$) as a reactant gas.

5. The method of claim 1, wherein the nitride layer is formed by a rapid thermal nitridation (RTN) process.

6. The method of claim 5, wherein the RTN process is performed at a temperature of about 800—1000°C under a pressure of atmospheric pressure or less using an ammonia ($NH_3$) gas as a reactant gas.

7. The method of claim 1, wherein the step of forming the oxidation preventing layer is performed by nitriding the surface of the bit lines and the first insulating layer.

8. The method of claim 7, wherein the nitriding step is performed by a plasma process using an ammonia ($NH_3$) gas.

9. The method of claim 8, wherein the plasma process is performed at a temperature of about 200—400°C for more than about one minute.

10. The method of claim 7, wherein the nitriding step is performed by a thermal annealing process.

11. The method of claim 10, wherein the thermal annealing process is performed at a temperature of about 800—900°C for more than about thirty minutes.

12. The method of claim 7, wherein the nitriding step is performed by a rapid thermal process.

13. The method of claim 12, wherein the rapid thermal process is performed at a temperature of about 800—1000°C for more than about one minute.

14. The method of claim 1, wherein the contact hole has a sidewall, and wherein the step of forming a storage electrode is preceded by a step of forming a spacer on the sidewall of the contact hole.

15. The method of claim 1, wherein the first and second insulating layers comprise a borophosphosilicate glass (BPSG) or an undoped silicate glass (USG).

16. The method of claim 1, wherein a nitride layer and an oxide layer are sequentially formed on the second insulating layer prior to the step of forming the contact hole.

17. A method of manufacturing a semiconductor device comprising:
    forming a pad on a semiconductor substrate;
    forming a first insulating layer on the semiconductor substrate;
    forming a plurality of bit lines on the first insulating layer, each of the plurality of bit lines including a plurality of bit line layers;
    forming an oxidation preventing layer at least on one of the plurality of bit lines, the oxidation preventing layer is a nitride layer and is arranged to contact all of the bit line layers of each bit line;
    forming a second insulating layer at least on the one of the plurality of bit lines;
    forming a contact hole exposing the pad on the semiconductor substrate, the oxidation preventing layer remaining interposed between the contact hole and the at least one of the plurality of bit lines;
    forming a storage electrode connected to the portion of the semiconductor substrate through the contact hole;
    forming a dielectric layer on the storage electrode; and
    forming a plate electrode on the dielectric layer.

18. The method of claim 17, wherein the oxidation preventing layer is formed over substantially the entire surface of the bit lines and the first insulating layer.

19. The method of claim 18, wherein the oxidation preventing layer is formed by nitriding the surface of the bit lines and the first insulating layer.

20. The method of claim 19, wherein the nitriding is performed by a process selected from the group consisting of a plasma process using ammonia gas, a thermal annealing process and a rapid thermal process.

21. The method of claim 18, wherein each of the bit lines has sidewalls and a top, and wherein the oxidation preventing layer is formed to be thicker on the sidewalls and on the top of the bit lines than on the first insulating layer.

22. The method of claim 17, wherein the oxidation preventing layer is formed on the storage electrode.

23. The method of claim 22, wherein the oxidation preventing layer is formed by nitriding the surface of the storage electrode and an adjacent substrate surface prior to forming the dielectric layer and the plate electrode.

24. The method of claim 23, wherein the nitriding is performed by a plasma process using an ammonia gas.

25. The method of claim 17, wherein the oxidation preventing layer is a dual spacer.

26. The method of claim 25, wherein the dual spacer is formed by forming a nitride spacer layer on the sidewall of the contact hole and forming an oxide spacer layer on the nitride spacer layer.

27. The method of claim 26, wherein the nitride spacer layer and oxide spacer layer in the dual spacer are each formed to a thickness of from about 100 to 300 angstroms.

* * * * *